United States Patent
Ho et al.

(10) Patent No.: US 11,145,600 B2
(45) Date of Patent: Oct. 12, 2021

(54) ELECTRONIC DEVICE WITH MULTILAYER ELECTRODE AND METHODS FOR MANUFACTURING THE SAME

(71) Applicant: InnoLux Corporation, Miao-Li County (TW)

(72) Inventors: Chia-Chi Ho, Miao-Li County (TW); Ming-Yen Weng, Miao-Li County (TW); I-Yin Li, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/672,859

(22) Filed: Nov. 4, 2019

(65) Prior Publication Data

US 2020/0161249 A1 May 21, 2020

Related U.S. Application Data

(60) Provisional application No. 62/769,611, filed on Nov. 20, 2018.

(30) Foreign Application Priority Data

Jun. 21, 2019 (CN) .......................... 201910541788.X

(51) Int. Cl.
| | | |
|---|---|---|
| *H01L 51/00* | (2006.01) | |
| *H01L 23/532* | (2006.01) | |
| *H01L 21/48* | (2006.01) | |
| *H01L 29/786* | (2006.01) | |
| *H01L 23/14* | (2006.01) | |
| *H01L 51/52* | (2006.01) | |
| *H01L 33/40* | (2010.01) | |

(52) U.S. Cl.
CPC .... *H01L 23/53238* (2013.01); *H01L 21/4814* (2013.01); *H01L 23/145* (2013.01); *H01L 29/7869* (2013.01); *H01L 33/40* (2013.01); *H01L 51/5203* (2013.01); *H01L 51/525* (2013.01); *H01L 51/5253* (2013.01)

(58) Field of Classification Search
None
See application file for complete search history.

(56) References Cited

U.S. PATENT DOCUMENTS

| | | | | |
|---|---|---|---|---|
| 2007/0013077 A1* | 1/2007 | Lee | ....................... | H01L 29/458 |
| | | | | 257/762 |
| 2011/0141411 A1* | 6/2011 | Park | .................... | G02F 1/13718 |
| | | | | 349/98 |
| 2013/0148072 A1* | 6/2013 | Jang | .................... | G02F 1/13452 |
| | | | | 349/150 |

* cited by examiner

*Primary Examiner* — Reema Patel
(74) *Attorney, Agent, or Firm* — McClure, Qualey & Rodack, LLP

(57) ABSTRACT

An electronic device is provided. The electronic device includes a first substrate. The electronic device also includes a multilayer electrode disposed on the first substrate. The multilayer electrode includes a first conductive layer, a second conductive layer disposed on the first conductive layer, and a third conductive layer disposed on the second conductive layer. The electronic device further includes a second substrate facing the first substrate. In addition, the electronic device includes a working medium disposed between the first substrate and the second substrate. The chemical electromotive force of the second conductive layer is between that of the first conductive layer and the third conductive layer.

20 Claims, 6 Drawing Sheets

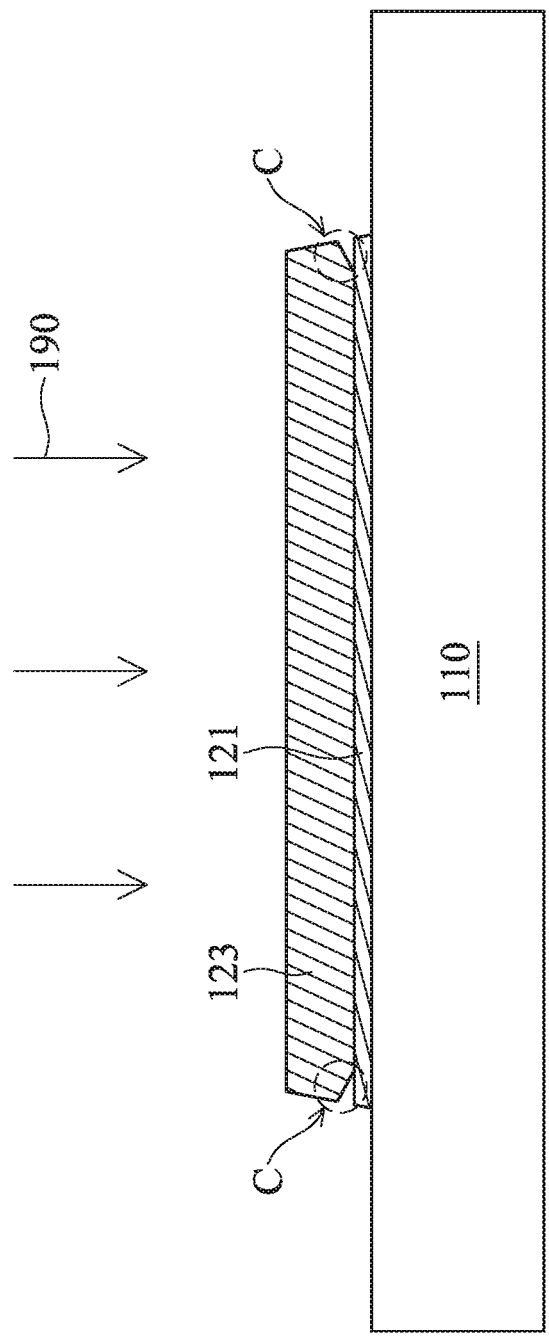

ELECTRONIC DEVICE WITH MULTILAYER ELECTRODE AND METHODS FOR MANUFACTURING THE SAME

CROSS REFERENCE TO RELATED APPLICATIONS

This application claims priority of China Patent Application No. 201910541788.X filed on Jun. 21, 2019, and also claims priority of a provisional application of U.S. Patent Application No. 62/769,611 filed on Nov. 20, 2018, the entirety of which are incorporated by reference herein.

BACKGROUND OF THE DISCLOSURE

Field of the Invention

The embodiments of the disclosure relate to an electronic device, and in particular to an electronic device including a multilayer electrode.

Description of the Related Art

As digital technology has advanced, electronic devices are widely used in society. Examples of these electronic devices include such modern information devices as televisions, notebooks, computers, mobile phones, and smartphones. In addition, these electronic devices have been developed to be thinner, lighter, smaller, and more fashionable.

When multiple metal layers are stacked to form an electrode of the electronic device, the metal layer having higher activity often generates gaps because of the difference in activity between the adjacent metal layers in the etching process for forming the electrode of the electronic device. Therefore, the reliability for existing electronic devices have not been satisfied, and a new electronic device is needed.

BRIEF SUMMARY OF THE DISCLOSURE

The present disclosure provides an electronic device. The electronic device includes a first substrate. The electronic device also includes a multilayer electrode disposed on the first substrate. The multilayer electrode includes a first conductive layer, a second conductive layer disposed on the first conductive layer, and a third conductive layer disposed on the second conductive layer. The electronic device further includes a second substrate facing the first substrate. In addition, the electronic device includes a working medium disposed between the first substrate and the second substrate. The chemical electromotive force of the second conductive layer is between the chemical electromotive force of the first conductive layer and the chemical electromotive force of the third conductive layer.

The present disclosure provides a method for manufacturing an electronic device. The method includes providing a first substrate. The method also includes forming a multilayer electrode on the first substrate. The step of forming the multilayer electrode includes forming a first conductive layer, a second conductive layer on the first conductive layer, and a third conductive layer on the second conductive layer. The method further includes providing a second substrate facing the first substrate. In addition, the method includes sealing a working medium between the first substrate and the second substrate. Chemical electromotive force of the second conductive layer is between that of the first conductive layer and the third conductive layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 3A and 3B illustrate cross-sectional views of process of comparative examples.

DETAILED DESCRIPTION

Figure 1:
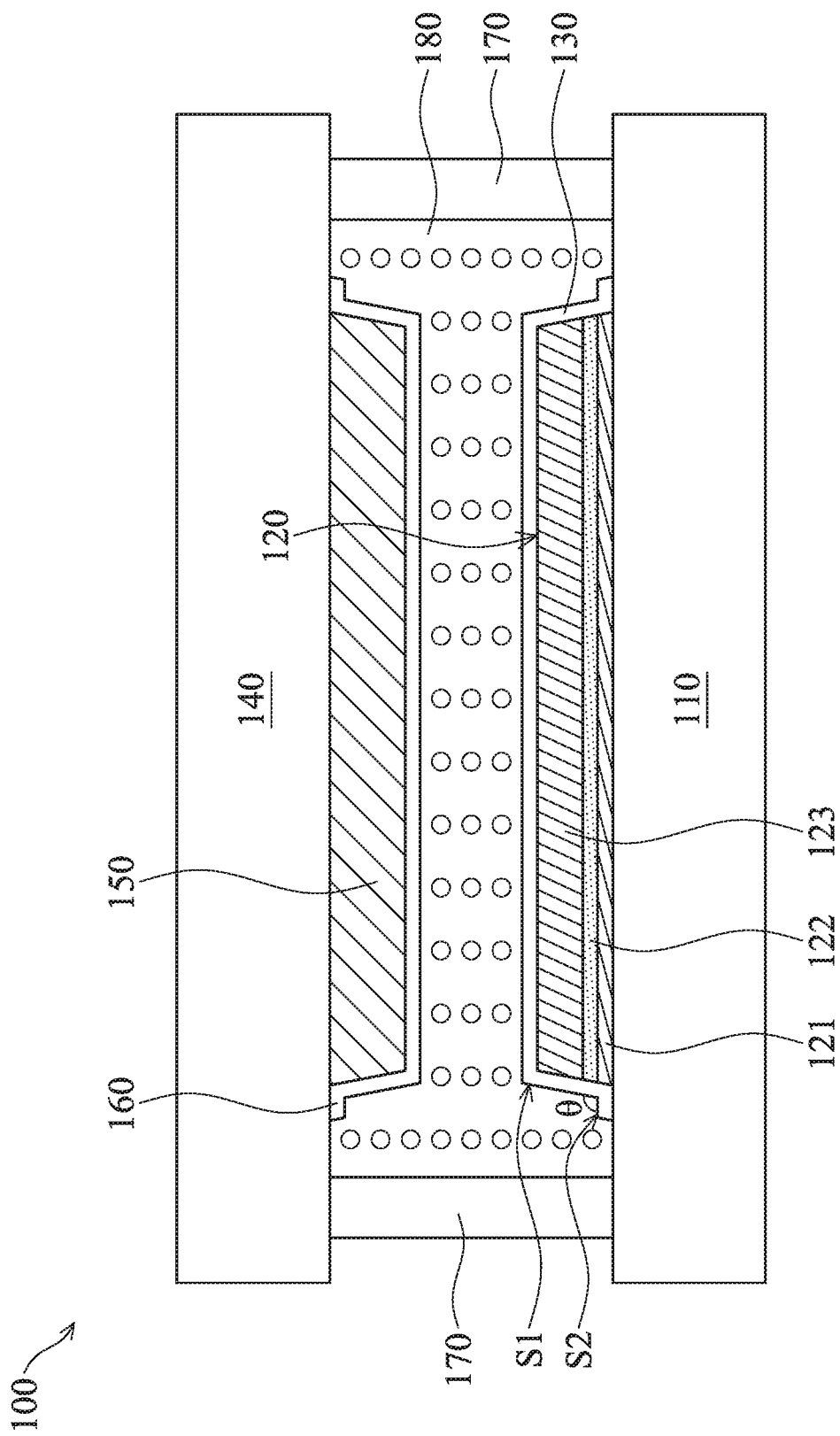
FIG. 1 illustrates a cross-sectional view of an electronic device in accordance with some embodiments of the present disclosure.

The electronic devices and methods for manufacturing the same of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−10% of the stated value, or typically mean +/−5% of the stated value, or typically mean +/−3% of the stated value, or typically mean +/−2% of the stated value, or typically mean +/−1% of the stated value or typically mean +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate or opaque substrate or the layers overlying the transparent substrate. All transistor element needed may be already formed over the substrate. However, the substrate is represented with a flat surface in order to simplify the drawing. The term "substrate surface" is meant to include the uppermost exposed layers on a transparent substrate, such as an insulating layer and/or metallurgy lines.

Refer to FIG. 1, which illustrates a cross-sectional view of an electronic device 100 in accordance with some embodiments of the present disclosure. To be noted that the electronic device 100 shown in FIG. 1 is merely an exemplary. In addition to the elements shown in FIG. 1, the electronic device 100 may further includes other elements.

As shown in FIG. 1, the electronic device 100 includes a first substrate 110. The first substrate 110 may include a non-flexible or a flexible substrate. The material of the first substrate 110 may include a glass substrate, a sapphire substrate, a ceramic substrate, a plastic substrate or other suitable substrates. The material of the plastic substrate may include, but is not limited to, polyimide (PI), polyethylene terephthalate (PET), polycarbonate (PC), polyether oxime (PES), polybutylene terephthalate (PBT), polynaphthalene ethylene glycolate (PEN), polyarylate (PAR), other suitable materials or a combination thereof.

The first substrate 110 may include a plurality of active elements or passive elements (not shown). The active elements may include thin film transistors (TFT), which may include switch transistor, driving transistor, reset transistor or other transistors. In some embodiments, the TFT may include at least one semiconductor layer.

The material of the semiconductor layer may include, but is not limited to amorphous silicon, polysilicon such as low-temp polysilicon (LTPS), metal oxide or other suitable materials. The metal oxide may include indium gallium zinc oxide (IGZO), indium zinc oxide (IZO), indium gallium zinc tin oxide (IGZTO), other suitable materials, or a combination thereof. For example, in an embodiment wherein the semiconductor layer is the indium gallium zinc oxide (IGZO) layer, the semiconductor layer may include different compositions of In, Ga, Zn and O, such as 1:1:1:4 or other suitable compositions. The semiconductor layers may be doped with dopants of p or n type. The passive device may include, but is not limited to, inductor, capacitor or other elements.

As shown in FIG. 1, the electronic device 100 may include a multilayer electrode 120. The multilayer electrode 120 may be used as a first electrode to drive working medium. In some embodiments, a patterning process may be performed on the multilayer electrode 120 so that the multilayer electrode 120 could have openings (not shown) to expose the first substrate 110. In some embodiments, the multilayer electrode 120 may include a first conductive layer 121, a second conductive layer 122 and a third conductive layer 123. The first conductive layer 121 is disposed on the first substrate 110; the second conductive layer 122 is disposed on the first conductive layer 121; and the third conductive layer 123 is disposed on the second conductive layer 122. The second conductive layer 122 is disposed between the first conductive layer 121 and the third conductive layer 123. The material of the first conductive layer 121, the second conductive layer 122 and the third conductive layer 123 may include metal and/or alloy. In some embodiments, the chemical electromotive force of the second conductive layer 122 is between that of the first conductive layer 121 and the third conductive layer 123.

In an embodiment, the adhesion between the first conductive layer 121 and the first substrate 110 is greater than the adhesion between the third conductive layer 123 and the first substrate 110, based on the requirements, the first conductive layer 121 may be selected to be used as an adhesive layer on the first substrate 110. In another embodiment, when less adhesion is required, the third conductive layer 123 can replace the first conductive layer 121 to be the adhesive layer on the first substrate; however, the scope of the disclosure is not intended to be limited. Whether the first conductive layer 121 is formed can depend on the material of the adaptability and the thickness of the first substrate 110, the first conductive layer 121 and the third conductive layer 123. In some embodiments, the thickness of the first conductive layer 121 is in a range from about 5 nm to about 50 nm (5 nm≤the thickness of the first conductive layer 121≤50 nm). In some embodiments, to ensure there is a stable adhesion between the conductive layer and the first substrate 110, or to reduce the consumption of the material of the first conductive layer 121, the thickness of the first conductive layer 121 is in a range from about 10 nm to about 30 nm (10 nm≤the thickness of the first conductive layer 121≤30 nm). In some embodiments, the material of the first conductive layer 121 may include, but is not limited to, molybdenum, titanium, molybdenum alloy and other suitable materials. The molybdenum alloy may include, but is not limited to, MoTi (molybdenum-titanium alloy) and MoNb (molybdenum-niobium alloy). The thickness of the above conductive layers may be defined as the average thickness of the conductive layers, such as the average of three or five measured thickness, along the normal direction of the first substrate 110 or the maximum thickness along the normal direction of the first substrate 110; in addition, the thickness of the above conductive layers may be measured by using a scanning electron microscope (SEM). In some embodiments, when the first substrate 110 is flexible, the first substrate 110 should be flattened before measuring the average thickness or maximum thickness of the conductive layers along the normal direction in the section of the first substrate 110.

The second conductive layer 122 may be used as a chemical potential difference adjustment layer: the second conductive layer 122 may be configured to prevent the first conductive layer 121 from being in direct contact with the third conductive layer 123; therefore, the chemical electromotive force of the material of the second conductive layer 122 should be between the chemical electromotive force of the first conductive layer 121 and the third conductive layer 123. In some embodiments, the thickness of the second conductive layer 122 is in a range from about 10 nm to about 100 nm. In some embodiments, to prevent the first conductive layer 121 from being in direct contact with the third conductive layer 123, or to reduce the consumption of the material of the second conductive layer 122, the thickness of the second conductive layer 122 is in a range of about 20 nm to about 80 nm; however, the scope of the disclosure is not intended to be limited: the thickness of the second conductive layer 122 may be selected according to the materials and the thickness of the first conductive layer 121 and the third conductive layer 123. In some embodiments, the material of the second conductive layer 122 may include, but is not limited to, copper alloy or other suitable materials.

The copper alloy mentioned above may include, but is not limited to, a copper-aluminum alloy such as aluminum bronze, aluminum brass; a copper-silicon alloy such as silicon bronze; a copper-tin-silicon alloy such as phosphor bronze; a copper-tin-zinc alloy; a copper-zinc alloy; a copper-zinc-tin alloy; a nickel-copper alloy; or other suitable alloy.

Here, chemical electromotive force (or electromotive force) may be the standard electrode electromotive force, which evaluates the ability of the material to receive electrons. The greater difference in electromotive force between two materials, the greater difference of activity between two materials. In addition, the electromotive force is determined by initial and final state of a material. For example, when initial and final oxidation number of Cu is 0 and $2^+$ respectively, the electromotive force may be −0.340V under the standard atmospheres. To be noted that the electromotive force may change under different materials and environment. In this embodiment, the electromotive force of the first conductive layer 121, the second conductive layer 122 and the third conductive layer 123 may be evaluated under the environment of used etchants. The standard voltage of the materials may be measured as follows: prepare a hydrogen electrode under standard condition (standard temperature and pressure, STP) as the electrode of a half cell, prepare a material to be measured as another electrode of the half cell, measuring the voltage during an oxidation-reduction reaction between the two half cells, and use this value as the standard voltage of the material. In one embodiment, the standard condition and/or the standard voltage may be, but is not limited to, consistent with IUPAC or another definition arbitrary selected. In some embodiments, the half-cell may include, but is not limited to, a conductive electrode, an electrolyte or a double layer structure formed naturally when separating the conductive electrode from the electrolyte.

Metal or alloy materials having better conductivity and low cost can be used as the third conductive layer 123; in addition, the thickness of the third conductive layer 123 can be modified according to the metal's electricity requirements. In some embodiments, the thickness of the third conductive layer 123 is less than or equivalent to 4 μm. In some embodiments, the thickness of the third conductive layer 123 is in a range from about 1 μm to about 4 μm, or from about 1.5 μm to about 3 μm. In some embodiments, the material of the third conductive layer 123 may include copper or other suitable materials.

According to the Galvanic Effect, when two metals having different activity are in direct contact with each other, an oxidation-reduction reaction occurs: the greater the difference of the activity, the more violent the oxidation-reduction reaction. In some embodiments, the material of the third conductive layer 123 is easier oxidized than the material of the first conductive layer 121—that is, the standard electrode electromotive force of the third conductive layer 123 is less than the standard electrode electromotive force of the first conductive layer 121. If the third conductive layer 123 and the first conductive layer 121 that have great difference of activity are in direct contact with each other, a gap will be formed on where the third conductive layer 123 is in direct contact with the first conductive layer 121 during the process of forming the multilayer electrode 120; during the formation of the passivation layer 130, the gap may make a crack be easily formed in the passivation layer 130. When the crack is formed, outer moisture may easily penetrate to the multilayer electrode 120, which degrades the reliability of the electronic device 100. The formation of the gap of the multilayer electrode 120 and the crack of the passivation layer 130 will be discussed in FIGS. 3A and 3B.

As shown in FIG. 1, the electronic device 100 further includes the passivation layer 130 that is conformally formed on the multilayer electrode 120. In addition, the passivation layer 130 may cover a portion of the top surface of the first substrate 110, and extend from the top surface of the first substrate 110 to the top surface of the multilayer electrode 120. The passivation layer 130 may have a surface S1 substantially parallel to the side surface of the multilayer electrode 120 and a surface S2 substantially parallel to the top surface of the first substrate 110. In some embodiments, an included angle θ between the surfaces S1 and S2 is in a range from about 30° to about 70° (30°≤θ≤70°). In some embodiments, the material of the passivation layer 130 may include insulation materials. The passivation layer 130 may include, but is not limited to, silicon nitride, silicon oxide and silicon oxynitride. In some embodiments, the thickness of the passivation layer 130 is in a range from about 50 nm to about 1 μm. The detail of the process flow of the multilayer electrode 120 and the passivation layer 130 will be discussed subsequently.

As shown in FIG. 1, the electronic device 100 further includes a second substrate 140 that faces the first substrate 110. The second substrate 140 may comprise non-flexible substrate or flexible substrate, the materials of the second substrate 140, for example, may include a glass substrate, a sapphire substrate, a ceramic substrate, a plastic substrate or other suitable substrates, wherein the material of the plastic substrate may include, but is not limited to, polyimide (PI), polyethylene terephthalate (PET), polycarbonate (PC), polyether oxime (PES), polybutylene terephthalate (PBT), polynaphthalene ethylene glycolate (PEN), polyarylate (PAR), other suitable materials or a combination thereof.

The electronic device 100 may further comprise an electrode 150. The electrode 150 is disposed on the second substrate 140. The electrode 150 may be regarded as a second electrode that may be used to drive the working medium. In some embodiments, the electrode 150 may include metal, such as molybdenum (Mo), titanium (Ti), copper (Cu), aluminum (Al), silver (Ag), tungsten (W), gold (Au), chromium (Cr), nickel (Ni), platinum (Pt), iridium (Ir), rhodium (Rh), indium (In), bismuth (Bi), alloy of the metal mentioned above however, the scope of the disclosure is not intended to be limited. In some embodiments, the electrode 150 may include a single layer or a multilayer structure. In some embodiments, the structure of the electrode 150 may be the same as or similar to that of the multilayer electrode 120; however, the scope of the disclosure is not intended to be limited. For example, the electrode 150 may be a multilayer structure of Mo/Cu alloy/Cu, Ti/Cu alloy/Cu, Mo alloy/Cu alloy/Cu or other suitable structure; however, the scope of the disclosure is not intended to be limited.

As shown in FIG. 1, the electronic device 100 may include a passivation layer 160 that is conformally formed on the electrode 150. In some embodiments, the material of the passivation layer 160 may include insulating materials. The passivation layer 160 may include, but is not limited to, silicon nitride, silicon oxide and silicon oxynitride.

In addition, the electronic device 100 may include a spacer layer 170. The spacer layer 170 may be used to support the first substrate 110 and the second substrate 140. The material of the spacer layer 170 may include polyimine, polyethylene terephthalate, polyethylene, polyether oxime, polycarbonate, polymethyl methacrylate, polybutylene terephthalate, polyethylene naphthalate ester, glass, acrylic polymer, siloxane polymer, photoresist or other suitable materials.

In some embodiments, the electronic device 100 may be, but is not limited to, a display device, an antenna device, a sensor device or a splicing apparatus. The electronic device 100 may be a flexible or a bended electronic device. In some embodiments, the electronic device 100 may be applied in a liquid crystal display; therefore, the electronic device 100 may include a working medium 180, which is disposed between the second substrate 140 and the first substrate 110. In some embodiments, the working medium 180 may be a liquid crystal layer, the material of the liquid crystal layer may include, but is not limited to, nematic liquid crystal, smectic liquid crystal, cholesteric liquid crystal, blue phase liquid crystal or other suitable materials so that the electronic device 100 can have a function of display; however, the scope of the disclosure is not intended to be limited. In addition, the liquid crystal display may be, but is not limited to, twisted nematic (TN) liquid crystal display, super twisted nematic (STN) liquid crystal display, double layer super twisted nematic (DSTN) liquid crystal display, vertical alignment (VA) liquid crystal display, in-plane switching (IPS) liquid crystal display, cholesteric liquid crystal display, blue phase liquid crystal display, fringe-field switching (FFS) liquid crystal display or other suitable liquid crystal display.

In some embodiments, the electronic device 100 may include an organic light-emitting diode (OLED) display device or an inorganic light emitting diode display device (not shown). The OLED may include a top electrode, a bottom electrode and an organic luminescent layer disposed between the top electrode and the bottom electrode. The inorganic light-emitting diode display device may include a quantum dot light-emitting diode (Q-LED), a micro LED or a mini LED. The luminescent layer of the micro LED or the mini LED may include, but is not limited to, fluorescence material, phosphor material, other suitable materials or a combination thereof.

In some embodiments, the electronic device 100 may be an antenna device, such as liquid-crystal antenna device; the electronic device 100 may also be a tiled device, such as display tiled device or antenna tiled device; the electronic device 100 may further be a combination thereof; however, the scope of the disclosure is not intended to be limited.

The top electrode and/or bottom electrode may include transparent conductive material, such as indium tin oxide (ITO), tin oxide (SnO), indium zinc oxide (IZO), indium gallium zinc oxide (IGZO), indium tin zinc oxide (ITZO), antimony tin oxide (ATO), antimony zinc oxide (AZO), a combination of the above or any other suitable transparent conductive material. Furthermore, the material of the top electrode and/or the bottom electrode may also include metal such as copper (Cu), aluminum (Al), molybdenum (Mo), tungsten (W), gold (Au), chromium (Cr), nickel (Ni), platinum (Pt), titanium (Ti), iridium (Ir), rhodium (Rh), or alloy of the abovementioned material.

The organic luminescent layer may be a single layer structure, such as an emitting layer (EML), a hole injection layer (HIL), a hole transport layer (HTL), an electron injection layer (EIL), or an electron transport layer (ETL). In some embodiments, the organic luminescent layer may be a multilayer structure that may be constituted of HIL, HTL, EIL and ETL. In some embodiments, the organic luminescent layer may be a multilayer structure constituted of EML, HIL, HTL, EIL and ETL.

Figure 2A:
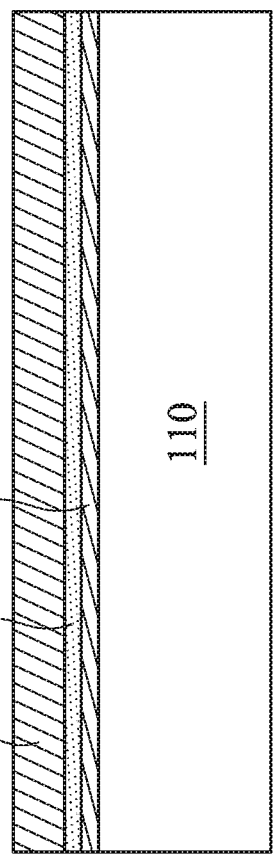
FIGS. 2A-2C illustrate cross-sectional views of various stages for forming the electrode and the passivation layer of an electronic device in accordance with some embodiments of the present disclosure.
Figure 2B:
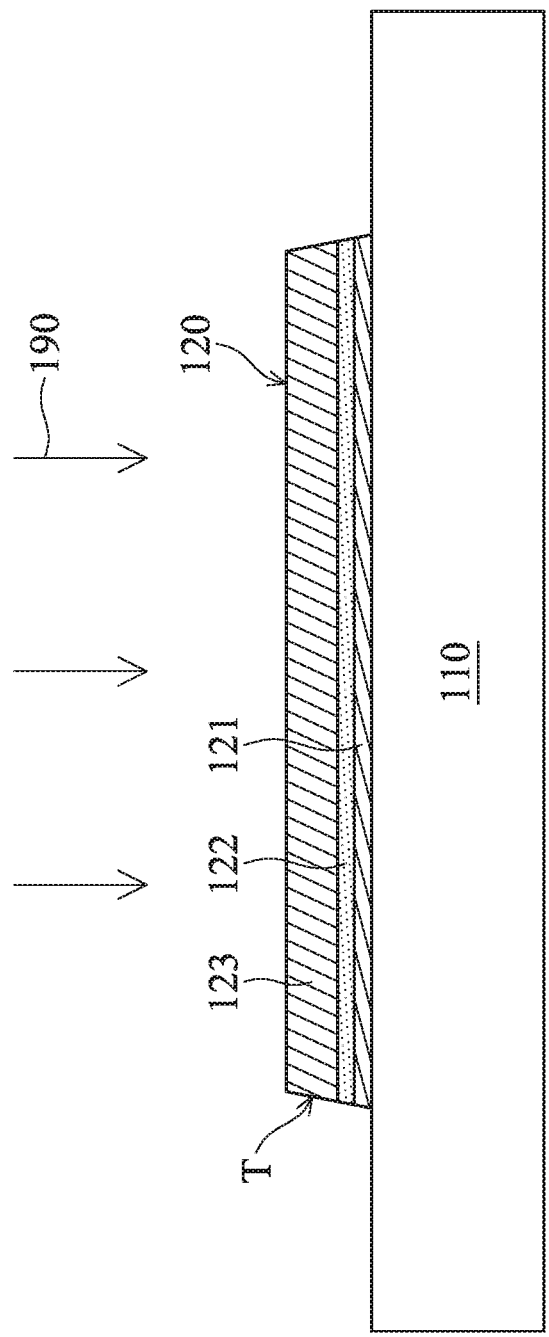
Figure 2C:
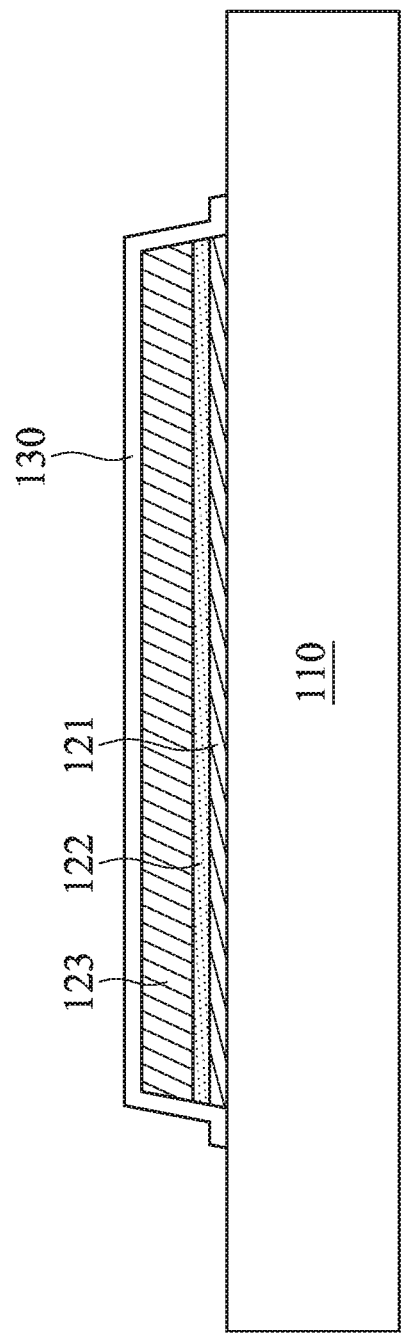

Refer to FIGS. 2A-2C, which illustrate cross-sectional views of various stages of forming the multilayer electrode 120 and the passivation layer 130 in accordance with some embodiments of the present disclosure. As shown in FIG. 2A, the first conductive layer 121, the second conductive layer 122 and the third conductive layer 123 may be sequentially formed on the first substrate 110 by deposition process, which may include, but is not limited to, plating, atomic layer deposition (ALD), chemical vapor deposition (CVD), physical vapor deposition (PVD) or a combination thereof.

As shown in FIG. 2B, an etching process 190 is performed to pattern the first conductive layer 121, the second conductive layer 122 and the third conductive layer 123, thereby forming the multilayer electrode 120. In some embodiments, the etching process is a single-step etching process. More specifically, the multilayer electrode 120 is formed by one etching process to pattern the first conductive layer 121, the second conductive layer 122 and the third conductive layer 123. In some embodiments, the etching process 190 includes using an etchant based on hydrogen peroxide. The etchant based on hydrogen peroxide may include hydrogen peroxide, acid, copper corrosion inhibitor, chelating agent, hydrogen peroxide stabilizer, water and other suitable ingredients.

The acid may include organic acid. Organic acid may include formic acid, acetic acid, propionic acid, butyric acid, valeric acid, malonic acid, succinic acid, glutaric acid, adipic acid, benzoic acid, antibutene acid, maleic acid, glyceric acid, lactic acid, glycolic acid, malic acid, t-valeric acid, pyruvic acid tartaric acid, citric acid, gluconic acid, N-(2-carboxyethyl)iminodiacetic acid, N-(2-hydroxyethyl)iminodiacetic, diacetic acid, diethylene triamine pentaacetic acid, iminodiacetic acid, lysine, serine, arginine and histidine or a combination thereof.

The hydrogen peroxide stabilizer may include, but is not limited to, urea peroxidation hydrogen stabilizer such as phenyl urea, acryl urea, 1,3-dimethylurea and thiourea, or phenyl acetamidoacetic acid, phenylethylene glycol and phenolsulfonic acid.

The copper corrosion inhibitor may include, but is not limited to, a heterocyclic compound containing at least one hetero atom selected from the group consisting of oxygen, sulfur, and nitrogen, such as oxazole, imidazole, pyrazole, triazole, tetrazole, 5-aminotetrazole, methyltetrazole, piperazine, methylpiperazine, hydroxyethylpiperazine, benzimidazole, benzpyrazole, tolutriazole, hydrotolutriazole or hydroxytolutriazole.

The above chelating agent may have the following functional groups: carboxylic acid, dicarboxylic acid, polycarboxylic acid, amino acid, an amine, diamine or polyamine; however, the scope of the disclosure is not intended to be limited.

Due to the Galvanic Effect, when two metals in contact with each other have great difference in activity, the corrosion rate of the metal that oxidizes easier will be accelerated. In this condition, after the etching of the metal layers, a gap may be formed in the metal layer that oxidizes more easily. In some embodiments, the second conductive layer 122, having an electromotive force between that of the first conductive layer 121 and the third conductive layer 123, is formed between them, which results in less difference in electromotive force between adjacent metal layers. As a result, it decreases the oxidation rate of the metal layer easier to be oxidized, and restrains formation of the gap. As shown in FIG. 2B, the multilayer electrode 120 may have a surface T that is continuous flat. In some embodiments, the multilayer electrode 120 does not have the gap. More specifically, after the etching process 190, the first conductive layer 121, the second conductive layer 122 and the third conductive layer 123 substantially do not have the gap.

In some embodiments, the difference in electromotive force between the second conductive layer 122 and the first conductive layer 121 may be in a range from about 0 to about 1V; the difference in electromotive force between the second conductive layer 122 and the third conductive layer 123 may be in a range from about 0 to about 1V. In some embodiments, the difference in electromotive force between the second conductive layer 122 and the first conductive layer 121 may be in a range from about 0 to about 0.5V; the difference in electromotive force between the second conductive layer 122 and the third conductive layer 123 may be in a range from about 0 to about 0.5V. When two adjacent metals have less difference in electromotive force, the corrosion of the metal having great activity can be decreased. In some embodiments, electromotive force of the second conductive layer 122 may be in a range from about −0.5V to about 0.5V. When the difference in electromotive force of the first conductive layer 121, the second conductive layer 122 and the third conductive layer 123 are in a range above, the corrosion of the conductive layers can be decreased.

As shown in FIG. 2C, the passivation layer 130 may be formed on the multilayer electrode 120 by a deposition process. The passivation layer 130 may be formed by ALD, AVD, PVD or another suitable process; however, the scope of the disclosure is not intended to be limited. If the multilayer electrode 120 has the gap, a crack may be generated during the formation of the passivation layer 130. In some embodiments, since the surface T, having a flat surface and no gap, is provided, the crack cannot be formed in the passivation layer 130. Furthermore, even though the passivation layer 130 has a much thinner thickness, moisture cannot penetrate into the multilayer electrode 120 because the crack is not formed. Therefore, the formation of the second conductive layer 122 between the first conductive layer 121 and the third conductive layer 123 can assist in improving the reliability of the electronic device 100.

Figure 3B:
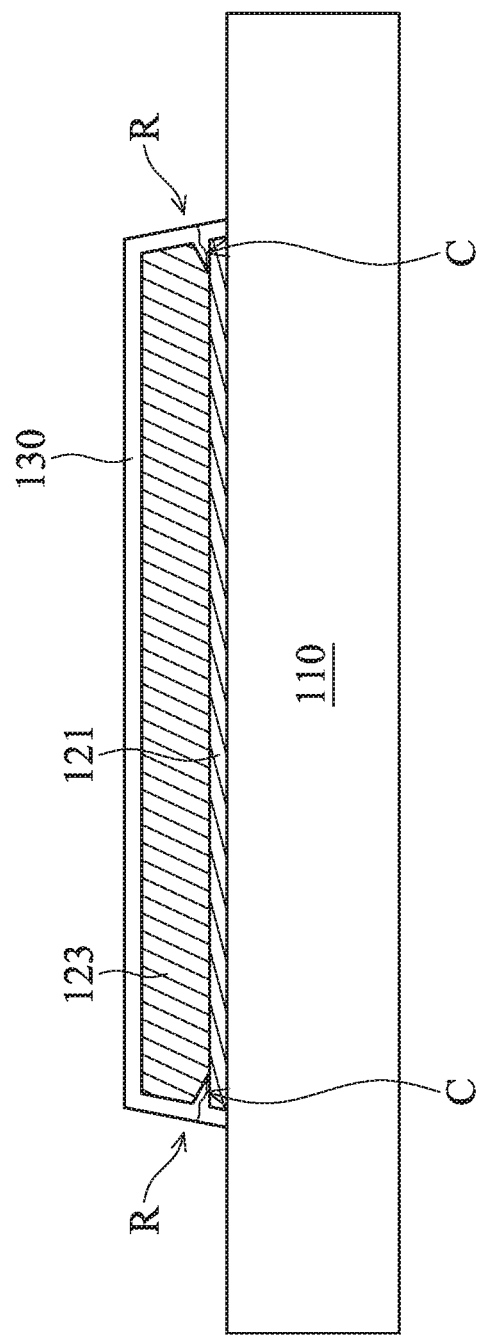

Refer to FIGS. 3A and 3B, which illustrate the sectional view of different stages of the process for forming the electrode and the passivation layer of comparative examples. As shown in FIG. 3A, if the second conductive layer 122 is not formed, the first conductive layer 121 may be in direct contact with the third conductive layer 123. After the etching process 190, the third conductive layer 123, which has greater activity, may have the gap C formed in interface between the first conductive layer 121 and the third conductive layer 123.

Next, as shown in FIG. 3B, the crack R is formed after forming of the passivation layer 130. In some condition, if the passivation layer 130 has a thinner thickness, the crack R may extend from the surface of the passivation layer 130 to the gap C of the third conductive layer 123; as a result, the reliability of the electronic device is degraded.

The electronic device of the disclosure may have at least one multilayer electrode. The multilayer electrode includes a first conductive layer, a third conductive layer and a second conductive layer formed between them. Electromotive force of the second conductive layer is in a range between electromotive force of the first conductive layer and third conductive layer. The multilayer electrode can be used as a first electrode or a second electrode to drive the working medium. In some embodiments, both the first electrode and the second electrode are constituted of the multilayer electrode. In some embodiments, formation of the first electrode and the second electrode can reduce the third electrode peeling or restrain corrosion of the third electrode. Therefore, the crack is not formed in the passivation layer that is formed on the multilayer electrode, thereby improving the reliability of the electronic device.

In some embodiments, the multilayer electrode of the disclosure can be used as an electrode to drive other electronic units, and the scope of the disclosure is not intended to be limited. To be noted that the embodiments of the disclosure may be applied in various display devices, sensor devices, antenna devices or other devices. The electronic device also includes such as tiled devices; however, the scope of the disclosure is not intended to be limited.

Although some embodiments of the present disclosure and their advantages have been described in detail, it should be understood that various changes, substitutions and alterations can be made by any person skilled in the art without departing from the spirit and scope of the disclosure. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each of the claims comprises an individual embodiment, and the scope of the disclosure also includes each of the claims and the combinations of the individual embodiment of the claims.

What is claimed is:

1. An electronic device, comprising:
    a first substrate;
    a multilayer electrode disposed on the first substrate, wherein the multilayer electrode comprises:
    a first conductive layer;
    a second conductive layer disposed on the first conductive layer; and
    a third conductive layer disposed on the second conductive layer;
    a second substrate facing the first substrate; and
    a working medium disposed between the first substrate and the second substrate, wherein a chemical electromotive force of the second conductive layer is greater than a chemical electromotive force of the first conductive layer and less than a chemical electromotive force of the third conductive layer.

2. The electronic device as claimed in claim 1, wherein the second conductive layer comprises copper alloy, and the third conductive layer comprises copper.

3. The electronic device as claimed in claim 2, wherein a thickness of the second conductive layer is in a range from 10 nm to 100 nm.

4. The electronic device as claimed in claim 2, wherein a thickness of the third conductive layer is in a range from 1 μm to 4 μm.

5. The electronic device as claimed in claim 1, wherein a material of the first conductive layer comprises molybdenum-titanium alloy.

6. The electronic device as claimed in claim 5, wherein a thickness of the first conductive layer is in a range from 5 nm to 50 nm.

7. The electronic device as claimed in claim 1, further comprising:
    a passivation layer disposed on the multilayer electrode.

8. The electronic device as claimed in claim 1, wherein the multilayer electrode is formed by a single-step etching process.

9. The electronic device as claimed in claim 8, wherein the single-step etching process uses an etchant based on hydrogen peroxide.

10. The electronic device as claimed in claim 9, wherein the etchant based on hydrogen peroxide comprises an acid, a copper corrosion inhibitor, a chelating agent, a hydrogen peroxide stabilizer and water.

11. A method for manufacturing the electronic device as set forth in claim 1, comprising:
    providing a first substrate;
    forming a first multilayer electrode on the first substrate, comprising:
        forming a first conductive layer on the first substrate;
        forming a second conductive layer on the first conductive layer; and
        forming a third conductive layer on the second conductive layer;
    providing a second substrate facing the first substrate; and
    sealing a working medium between the first substrate and the second substrate;
    wherein a chemical electromotive force of the second conductive layer is greater than a chemical electromotive force of the first conductive layer and less than a chemical electromotive force of the third conductive layer.

12. The method as claimed in claim 11, wherein the second conductive layer comprises copper alloy, and the third conductive layer comprises copper.

13. The method as claimed in claim 12, wherein a thickness of the second conductive layer is in a range from 10 nm to 100 nm.

14. The method as claimed in claim 12, wherein a thickness of the third conductive layer is in a range from 1 μm to 4 μm.

15. The method as claimed in claim 11, wherein a material of the first conductive layer comprises molybdenum-titanium alloy.

16. The method as claimed in claim 15, wherein a thickness of the first conductive layer is in a range from 5 nm to 50 nm.

17. The method as claimed in claim 11, further comprising:
    forming a passivation layer on the multilayer electrode.

18. The method as claimed in claim 11, wherein the step of forming the multilayer electrode includes performing a single-step etching process.

19. The method as claimed in claim 18, wherein the single-step etching process uses an etchant based on hydrogen peroxide.

20. The method as claimed in claim 19 wherein the etchant based on hydrogen peroxide comprises an acid, a copper corrosion inhibitor, a chelating agent, a hydrogen peroxide stabilizer and water.

* * * * *